United States Patent
Koo

(10) Patent No.: US 7,688,234 B2
(45) Date of Patent: Mar. 30, 2010

(54) CODING APPARATUS, CODING METHOD, PROGRAM FOR EXECUTING THE METHOD, AND RECORDING MEDIUM STORING THE PROGRAM

(75) Inventor: Sung-Yul Koo, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/199,605

(22) Filed: Aug. 27, 2008

(65) Prior Publication Data
US 2009/0058691 A1    Mar. 5, 2009

(30) Foreign Application Priority Data
Aug. 28, 2007    (JP)    ............... P2007-220596

(51) Int. Cl.
*H03M 7/00*    (2006.01)
(52) U.S. Cl. ........................ 341/107; 341/60
(58) Field of Classification Search ............ 341/50–107
See application file for complete search history.

(56) References Cited

U.S. PATENT DOCUMENTS 6,677,869 B2 *   1/2004   Horie ..................... 341/107
6,864,813 B2 *   3/2005   Horie ..................... 341/107
7,190,289 B2 *   3/2007   Kobayashi et al. .......... 341/107
7,298,303 B2 *  11/2007   Kobayashi et al. .......... 341/107
2005/0243930 A1  11/2005  Asano et al.

FOREIGN PATENT DOCUMENTS

JP          2005-318296         11/2005

OTHER PUBLICATIONS

Toshiba Review, vol. 60, No. 1, (2005), p. 17-20.

* cited by examiner

*Primary Examiner*—Lam T Mai
(74) *Attorney, Agent, or Firm*—Finnegan, Henderson, Farabow, Garrett & Dunner, L.L.P.

(57) ABSTRACT

A coding apparatus that codes video data using an arithmetic coding scheme such as the AVC standard includes an orthogonal transformation unit, a quantizer, an arithmetic coder, and a controller. The arithmetic coder includes a binarization unit, a binary arithmetic coder, and a code length predictor. The code length predictor outputs a predicted number of bits by evaluating a predictive function using, as the argument of the function, the bin size of the binary symbols generated from input data during coding. The controller controls the coding bit rate by changing the quantization scale of the quantizer on the basis of the predicted number of bits. The predictive function is defined such that the predicted number of bits increases as the bin size increases, and furthermore such that the polynomial degree of the function changes when the bin size exceeds a predefined threshold value.

12 Claims, 10 Drawing Sheets

FIG. 4

| BIN SIZE | PREDICTED NUMBER OF BITS |
|---|---|
| ⋮ | ⋮ |
| 425 | 395 |
| 426 | 396 |
| 427 | 397 |
| 428 | 398 |
| 429 | 399 |
| 430 | 400 |
| 431 | 401 |
| 432 | 402 |
| 433 | 403 |
| 434 | 404 |
| 435 | 405 |
| 436 | 405 |
| 437 | 406 |
| ⋮ | |

CODING APPARATUS, CODING METHOD, PROGRAM FOR EXECUTING THE METHOD, AND RECORDING MEDIUM STORING THE PROGRAM

CROSS REFERENCES TO RELATED APPLICATIONS

The present invention contains subject matter related to Japanese Patent Application JP 2007-220596 filed in the Japanese Patent Office on Aug. 28, 2007, the entire contents of which are incorporated herein by reference.

BACKGROUND OF THE INVENTION

1. Field of the Invention

The present invention relates to a coding apparatus, a coding method, a program for executing the method, and a recording medium storing the program, the above being applicable for use in the coding of video data by means of the H.264 ISO/IEC 14496-10 AVC coding method (hereinafter referred to as AVC). More particularly, the present invention relates to configurations for arithmetic coding processing wherein the bit rate is controlled by predicting the number of generated bits from the bin size, such prediction being conducted with the use of a predictive function whose polynomial degree changes once the bin size exceeds a threshold value. The configurations of the present invention are simpler than those of the related art, and thus the scale of the circuitry involved therein and the energy-consumed thereby is reduced.

2. Description of the Related Art

Various video equipment of the related art codes video data using coding methods such as Moving Picture Experts Group Phase 2 (MPEG-2), MPEG-4, and AVC. Among such coding methods, the AVC coding method is more computationally intensive for coding and decoding than the MPEG-2 and MPEG-4 coding methods. At the same time, however, with AVC it is possible to obtain higher compression ratios compared to those of MPEG-2 and MPEG-4.

AVC includes two high-efficiency coding schemes: context-adaptive variable length coding (CAVLC) and context-adaptive binary arithmetic coding (CABAC). Syntax elements are entropy coded using one of the above two schemes. Regardless of which scheme is used, AVC is able to adaptively assign symbols according to conditions in surrounding blocks, and thus higher compression ratios can be obtained compared to those of MPEG-2 and MPEG-4. Additionally, since CABAC is an arithmetic coding process, CABAC can assign symbols more efficiently than CAVLC. Consequently, the coding efficiency (i.e., the compression ratio) can be improved by using CABAC rather than CAVLC.

FIG. 9 is a block diagram illustrating the configuration of an AVC coding apparatus of the related art. The coding apparatus 1 implements CABAC. In the coding apparatus 1, a predictive coder 2 codes input picture data D1 with the use of prediction values. Subsequently, an arithmetic coder 3 codes each syntax element using CABAC.

The input picture data D1 received as input by the predictive coder 2 has been sorted by frame according to the GOP structure, the sorting conducted by means of a sort circuit not shown in the drawings. In the predictive coder 2, a subtractor 5 first subtracts prediction values D2 from the input picture data D1, and then outputs the resulting prediction error. An orthogonal transformation unit 6 is made up of a discrete cosine transform circuit or similar circuit that applies an orthogonal transformation to the prediction error and then outputs the resulting coefficient data. The quantization scale in a quantizer 7 is switched as a result of control by a rate controller 8A provided in a controller 8. The quantizer 7 quantizes the coefficient data output from the orthogonal transformation unit 6, outputting the results as quantized data D3.

A dequantizer 9 dequantizes the data D3 output from the quantizer 7, thereby restoring the data that was input into the quantizer 7. An inverse orthogonal transformation unit 10 then applies an inverse orthogonal transformation to the data output from the dequantizer 9, thereby restoring the data that was input into the orthogonal transformation unit 6. An adder 11 adds the prediction values D2 to the data output from the inverse orthogonal transformation unit 10, thereby restoring the input picture data D1. Frame memory 12 then stores the decoded input picture data D1 as reference picture data. The predictive coder 2 subsequently performs inter-prediction, wherein motion in the reference picture data stored in the frame memory is compensated for using a motion compensator 13, thereby generating prediction values D2. The predictive coder 2 also performs intra-prediction, wherein prediction values D2 are generated using an intra-prediction unit not shown in the drawings. The predictive coder 2 then inputs the output data from the quantizer 7 into the arithmetic coder 3 along with motion vectors, prediction mode data, or other information.

In the arithmetic coder 3, a binarization unit 15 converts the many-valued syntax elements from the output data of the quantizer 7, the motion vectors, and the prediction mode data into binary values, the binarization being conducted according to rules that depend on the type of the respective syntax elements. The binarization unit 15 then outputs the resulting series of variable-length binary symbols.

A context calculation unit 16 then conducts context calculation on each bit of the binary symbols to be output from the arithmetic coder 3. The context calculation is conducted on the basis of information about surrounding data to be coded and the values of already-coded binary symbols, and solves for a probability state variable indicating the probable value of each bit in the binary symbol being processed. The context calculation unit 16 stores the probability state variables in a probability table format, for example, and probability state variables that have been solved for are issued to a binary arithmetic coder 17 by means of the probability table. In addition, upon solving for the probability state variable of a single binary symbol, the context calculation unit 16 updates the corresponding probability state variable recorded in the probability table.

Using the probability table issued from the context calculation unit 16, the binary arithmetic coder 17 codes and outputs the current binary symbols being processed. A buffer 18 stores the output data from the binary arithmetic coder 17 along with header information or similar data, and then outputs the resulting coded data D4 as part of a bitstream.

The controller 8 controls the operation of the coding apparatus 1, selecting the optimal prediction mode by which to process the input picture data D1, and issuing commands to the motion compensator 13 and intra-prediction unit for generating prediction values D2 according to the optimal prediction mode. Additionally, the controller 8 executes rate control processing by using the rate controller 8A to switch the quantization scale of the quantizer 7.

FIG. 10 is a block diagram illustrating the configuration of the coding apparatus 1 with regard to the processing of the rate controller 8A provided in the controller 8. In FIG. 10, ME is a motion vector detection (i.e., motion estimation) circuit. During the bit allocation processing in step SP1, the controller 8 distributes allocatable bits to each picture and calculates a target number of bits for the picture currently being coded. The controller 8 also calculates the target number of bits per rate control unit from the picture currently being coded. The rate control unit herein is the coding unit of the coding apparatus 1 (i.e., a macroblock).

More specifically, the controller 8 divides the target bit rate of the coded data D4 to be output from the coding apparatus 1 by the number of GOPs per unit time, thus yielding the target number of bits allocatable to a single GOP. The controller 8 may also distribute the target number of bits for a single GOP thus calculated to each picture according to a ratio defined by picture type, thereby calculating the target number of bits for the picture currently being coded. The controller 8 may also divide the target number of bits for the picture currently being coded by the number of macroblocks constituting a single picture, and thereby calculate the target number of bits for a single macroblock. The controller 8 then issues the calculated target number of bits for a single macroblock to the rate controller 8A.

When calculating the target number of bits for a coding unit-block, the controller 8 may also monitor the number of bits in the coded data D4 generated as a result of the coding processing by monitoring the amount of free space in the buffer 18. Every time the coding for a single picture is completed, the controller 8 re-calculates, from the coded data D4 of the single picture, the target number of bits allocatable to the remaining pictures that constitute the current GOP. The re-calculated target number of bits may also be distributed to each picture according to picture type, thereby calculating the target number of bits for the next picture to be coded. The controller 8 may also re-calculate the target number of bits for a single macroblock from the target number of bits of the next picture to be coded, and then issue the re-calculated target number of bits to the rate controller 8A.

During the processing by the rate controller 8A as indicated by step SP2, the controller 8 may control the quantization scale of the controller 8 using a feedback control of the rate controller 8A, such that the number of bits in the coded data D4 becomes the target number of bits calculated in step SP1. More specifically, the controller 8 outputs quantization scale data DQ that determines the quantization scale of the quantizer 7 according to the target number of bits that was issued as a result of the bit allocation processing in step SP1. In this case, the controller 8 corrects and outputs the quantization scale data DQ according to the number of bits in the coded data D4 for the preceding macroblock. More specifically, when the number of bits in the coded data D4 is large with respect to the target number of bits, the quantization scale data DQ is corrected such that the quantization step size is increased and the number of generated bits is decreased. In contrast, when the number of bits in the coded data D4 is small with respect to the target number of bits, the quantization scale data DQ is corrected such that the quantization step size is decreased and the number of generated bits is increased. In this case, the quantization scale data DQ may be corrected using the actual number of bits in the coded data D4 as detected by the binary arithmetic coder 17, rather than the number of bits in the coded data D4 found by monitoring the buffer 18.

Using an activity detector not shown in the drawings, the coding apparatus 1 analyzes the input picture data D1 and detects per-macroblock activity that indicates coding difficulty. The activity herein may be calculated as the sum of squares or the sum of the absolute values of the high-activity area in the input picture data D1, or alternatively, the sum of squares of the sum of the absolute values of the prediction error output from the subtractor 5.

During the correction processing in step SP3, the controller 8 corrects the quantization scale data DQ calculated by the rate controller 8A according to the level of activity, and then outputs the corrected quantization scale to the quantizer 7. More specifically, for the portions having high activity wherein a degraded picture would be noticeably apparent, the quantization scale data DQ is corrected such that the quantization step size is decreased. In contrast, for the portions having low activity wherein a degraded picture would not be noticeably apparent, the quantization scale data DQ is corrected such that the quantization step size is increased.

Methods have been proposed regarding AVC coding for easily detecting the number of generated code bits, this number serving as a basis for the selection of the optimal prediction mode (cf. JP-A-2005-318296 and Toshiba Review, Vol. 60, No. 1 (2005), 17-20). The technique disclosed in JP-A-2005-318296 involves detecting the number of generated code bits by summing the bin sizes of the binary symbols output from the arithmetic coder 3. The proposal disclosed in Toshiba Review involves detecting the number of generated coded bits by calculating a linear approximation using cumulative values of the bin sizes of the binary symbols. The bin size herein refers to the number of bits in a binary symbol.

The rate controller previously described with reference to FIG. 10 uses a feedback control based on the number of bits generated in the arithmetic coding processing. Consequently, real-time coding of the input picture data D1 by the coding apparatus 1 requires that the arithmetic coder 3 process binary symbols at high speeds. However, the processing conducted by the arithmetic coder 3 is very computationally intensive. Consequently, there is a problem in that if a coding apparatus 1 in accordance with the related art is to code the input picture data D1 in real-time, then the scale of circuitry involved is increased due to the increased complexity in the configuration of the arithmetic coder 3, and furthermore energy consumption is also increased.

SUMMARY OF THE INVENTION

Being devised in light of the above, the present invention provides a coding apparatus, a coding method, a program for executing the method, and a recording medium storing the program, wherein the portions of the configuration relating to arithmetic coding have been simplified compared to that of the related art, and thus wherein the scale of the circuitry involved therein, as well as the energy consumed thereby, have been reduced.

A coding apparatus in accordance with an embodiment of the present invention is provided with an orthogonal transformation unit that applies an orthogonal transformation to an input signal and outputs the resulting coefficient data, a quantizer that quantizes the coefficient data, an arithmetic coder that performs arithmetic coding on the output data from the quantizer and outputs the resulting coded data, and a controller that executes rate control processing to control the quantization scale of the quantizer. The arithmetic coder includes a binarization unit that converts the output data from the quantizer into binary symbols, a binary arithmetic coder that performs binary arithmetic coding on the binary symbols and outputs the resulting coded data, and a code length predictor that outputs a predicted number of bits in the coded data on the basis of the bin size of the binary symbols. The controller executes rate control processing to control the quantization scale of the quantizer on the basis of the predicted number of bits. The code length predictor outputs the predicted number of bits by evaluating a predefined predictive function using the bin size as the argument of the function. The predictive function is a polynomial function defined such that the predicted number of bits increases as the bin size increases, and furthermore such that the polynomial degree of the function changes when the bin size exceeds a predefined threshold value.

A coding method in accordance with another embodiment of the present invention includes the steps of applying an orthogonal transformation to an input signal and outputting the resulting coefficient data, quantizing the coefficient data, performing arithmetic coding on the output data from the quantizing step and outputting the resulting coded data, and executing rate control processing to control the quantization scale used in the quantizing step. The arithmetic coding step further includes the steps of converting the output data from the quantizing step into binary symbols, performing binary arithmetic coding on the binary symbols and outputting the resulting coded data, and predicting code length by outputting a predicted number of bits in the coded data on the basis of the bin size of the binary symbols. In the rate control step, rate control processing is executed to control the quantization scale used in the quantizing step on the basis of the predicted number of bits. In the code length prediction step, the predicted number of bits is output by evaluating a predefined predictive function using the bin size as the argument of the function. The predictive function is a polynomial function defined such that the predicted number of bits increases as the bin size increases, and furthermore such that the polynomial degree of the function changes when the bin size exceeds a predefined threshold value.

A program for executing a coding method that codes an input signal in accordance with another embodiment of the present invention includes the steps of applying an orthogonal transformation to an input signal and outputting the resulting coefficient data, quantizing the coefficient data, performing arithmetic coding on the output data from the quantizing step and outputting the resulting coded data, and executing rate control processing to control the quantization scale used in the quantizing step. The arithmetic coding step further includes the steps of converting the output data from the quantizing step into binary symbols, performing binary arithmetic coding on the binary symbols and outputting the resulting coded data, and predicting code length by outputting a predicted number of bits in the coded data on the basis of the bin size of the binary symbols. In the rate control step, rate control processing is executed to control the quantization scale used in the quantizing step on the basis of the predicted number of bits. In the code length prediction step, the predicted number of bits is output by evaluating a predefined predictive function using the bin size as the argument of the function. The predictive function is a polynomial function defined such that the predicted number of bits increases as the bin size increases, and furthermore such that the polynomial degree of the function changes when the bin size exceeds a predefined threshold value.

A recording medium storing a program for executing a coding method that codes an input signal in accordance with another embodiment of the present invention includes the steps of applying an orthogonal transformation to an input signal and outputting the resulting coefficient data, quantizing the coefficient data, performing arithmetic coding on the output data from the quantizing step and outputting the resulting coded data, and executing rate control processing to control the quantization scale used in the quantizing step. The arithmetic coding step further includes the steps of converting the output data from the quantizing step into binary symbols, performing binary arithmetic coding on the binary symbols and outputting the resulting coded data, and predicting code length by outputting a predicted number of bits in the coded data on the basis of the bin size of the binary symbols. In the rate control step, rate control processing is executed to control the quantization scale used in the quantizing step on the basis of the predicted number of bits. In the code length prediction step, the predicted number of bits is output by evaluating a predefined predictive function using the bin size as the argument of the function. The predictive function is a polynomial function defined such that the predicted number of bits increases as the bin size increases, and furthermore such that the polynomial degree of the function changes when the bin size exceeds a predefined threshold value.

As a result of the configurations in accordance with the embodiments described above, the number of generated bits can be predicted within a fixed range before performing binary arithmetic coding. Consequently, binary arithmetic coding can be performed at lower speeds compared to the case wherein the bit rate is controlled according to the number of bits in the coded data after performing binary arithmetic coding. As a result, rate control can be performed at sufficiently high speeds even if the portions of the configuration related to binary arithmetic coding are simplified such that the scale of circuitry involved therein and the energy consumed thereby are reduced. Thus, in the present invention, the portions of the configuration related to arithmetic coding are simplified compared to that of the related art, such that the scale of circuitry involved therein and the energy consumed thereby are reduced.

BRIEF DESCRIPTION OF THE DRAWINGS

FIG. 4 is a chart to aid in the explanation of a look-up table;

DESCRIPTION OF THE PREFERRED EMBODIMENTS

Hereinafter, embodiments of the present invention will be described in detail and with reference to the accompanying drawings.

First Embodiment (1) Configuration of the Embodiment

Figure 1:
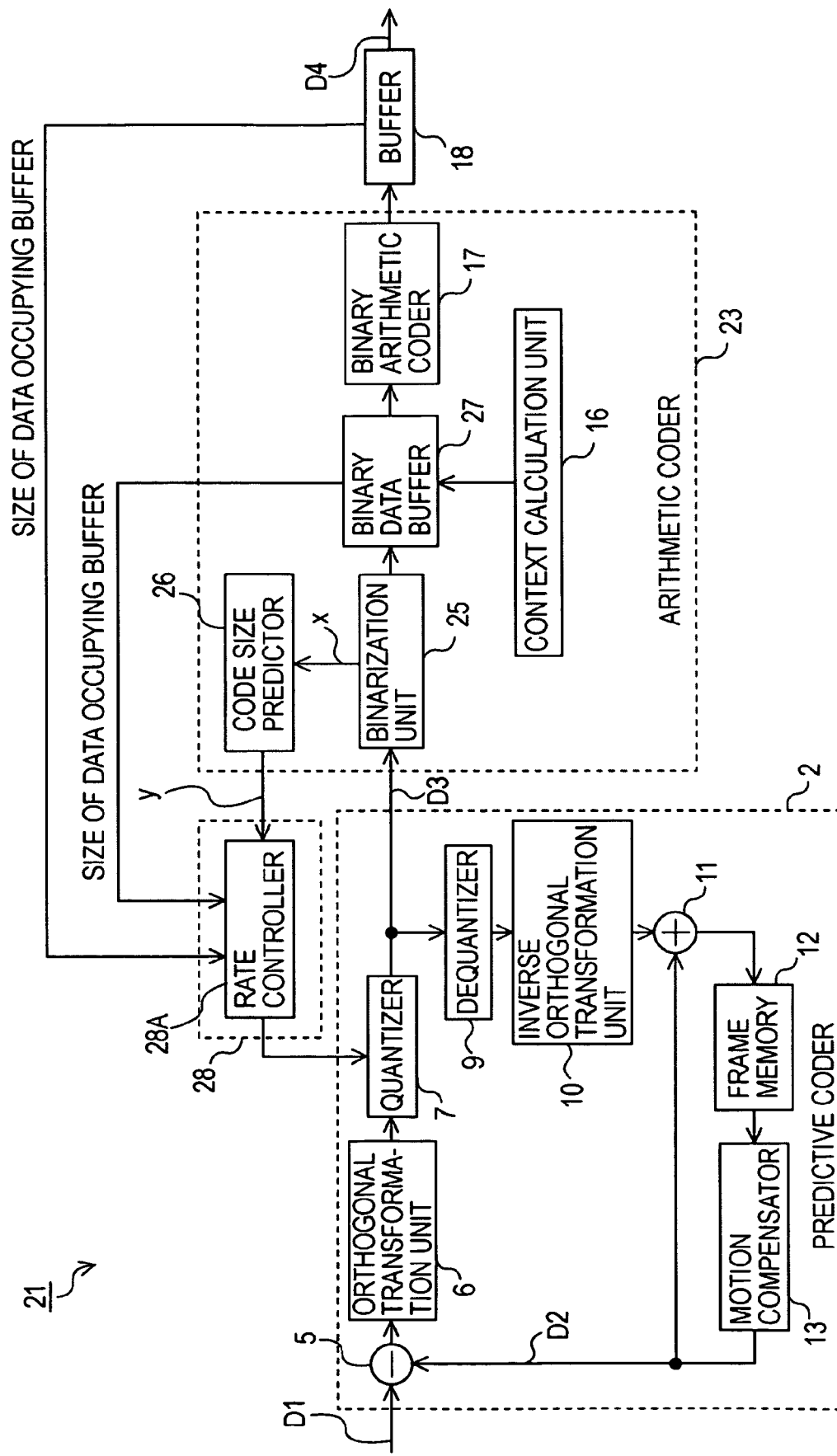
FIG. 1 is a block diagram illustrating the configuration of a coding apparatus in accordance with a first embodiment of the present invention.
Figure 9:
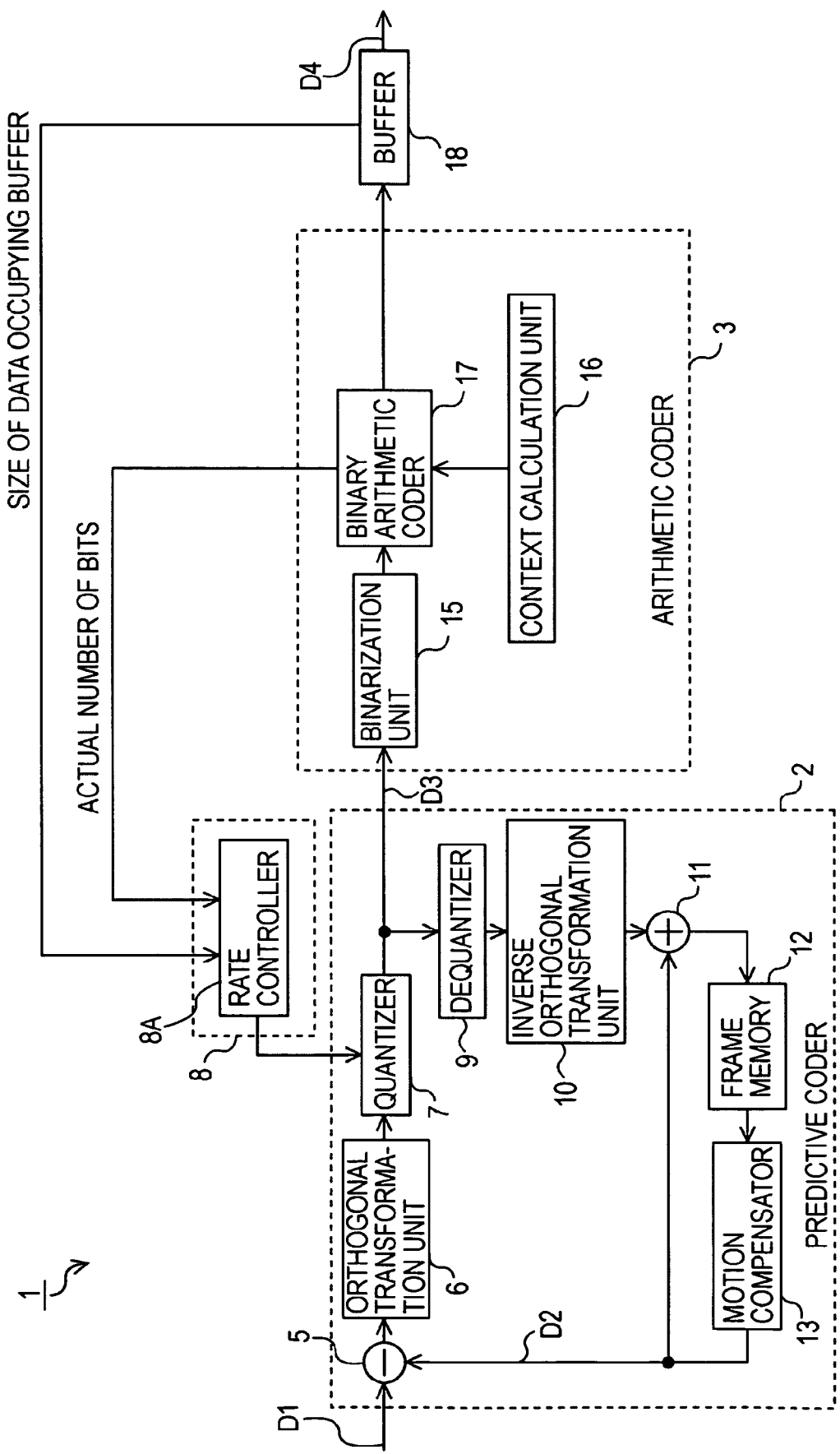
FIG. 9 is a block diagram illustrating the configuration of a coding apparatus of the related art.

FIG. 1 is a block diagram illustrating the configuration of a coding apparatus in accordance with a first embodiment of the present invention. The coding apparatus 21 depicted in FIG. 1 is configured identically to the coding apparatus 1 previously described with reference to FIG. 9, except in that an arithmetic coder 23 and a controller 28 have been provided in place of the arithmetic coder 3 and the controller 8, respectively. Furthermore, the arithmetic coder 23 is configured identically to the arithmetic coder 3 of the coding apparatus 1 previously described with reference to FIG. 9, except in that a binarization unit 25, a code length predictor 26, and a binary data buffer 27 have been provided in place of the binarization unit 15.

In the arithmetic coder 23, the binarization unit 25 operates similarly to the binarization unit 15, converting the many-valued syntax elements from the output data of the quantizer 7, motion vectors, and prediction mode data into binary values, the binarization being conducted according to rules that depend on the type of the respective syntax element. The binarization unit 25 then outputs the resulting series of variable-length binary symbols. The binarization unit 25 also keeps a running total of the bin sizes of the binary symbol series, and outputs a cumulative bin size x to the code length predictor 26.

The code length predictor 26 calculates a predicted value y for the number of bits in the coded data D4 (hereinafter referred to as the predicted number of bits), the value y being calculated from the bin size x using a predefined predictive function $y=f(x)$. The code length predictor 26 then issues the predicted number of bits y thus calculated to the controller 28.

Figure 2:
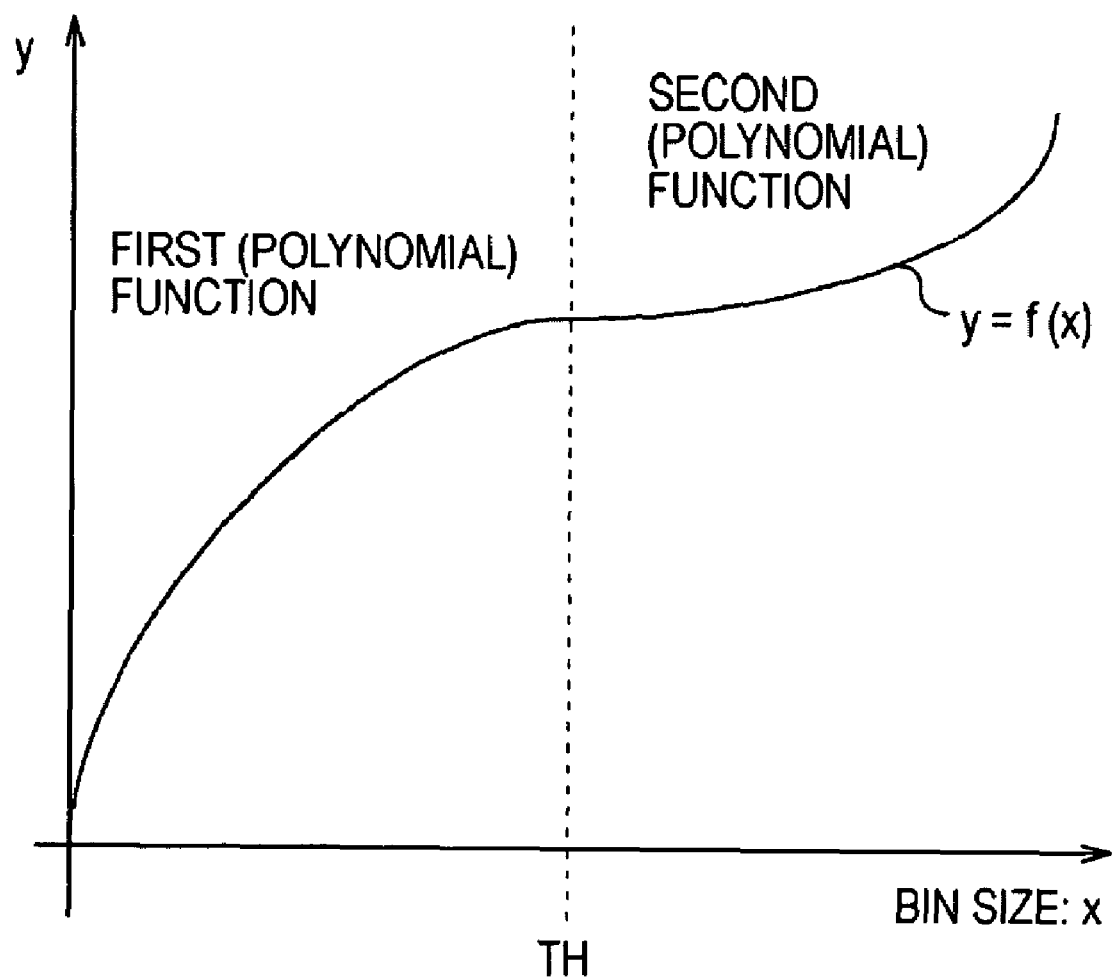
FIG. 2 is a graph of a characteristic curve to aid in the explanation of the predictive function of the coding apparatus shown in FIG. 1.

The predictive function $y=f(x)$ herein is a polynomial function that returns a predicted number of bits y for a given bin size x. In the present embodiment, the predictive function $y=f(x)$ is a monotonically increasing function (i.e., the predicted number of bits y increases as the bin size x increases) whose polynomial degree changes once the bin size x exceeds a predetermined threshold value TH, as shown in FIG. 2.

Figure 3:
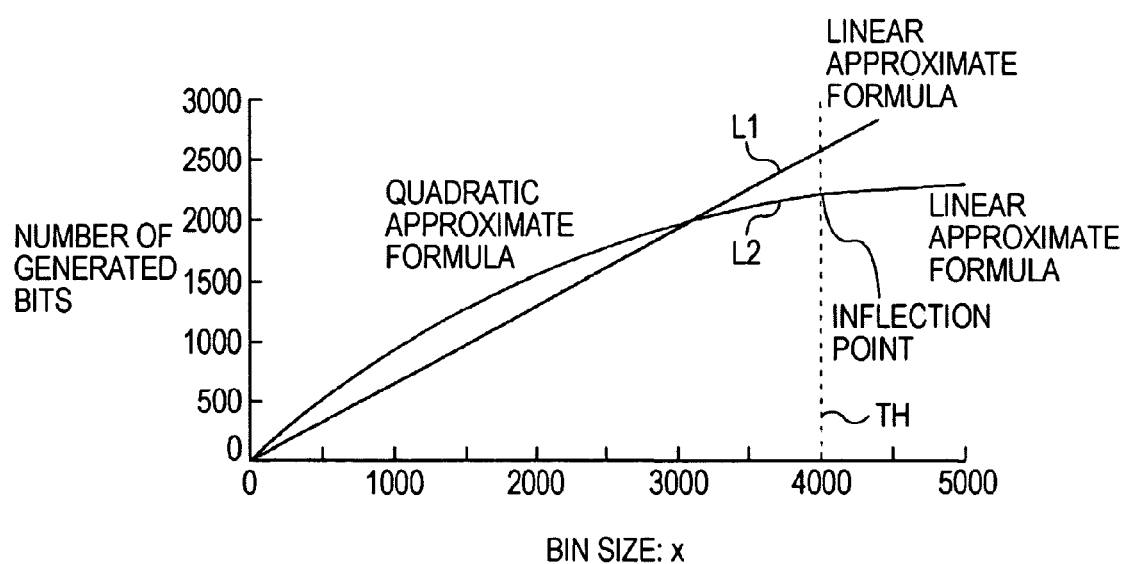
FIG. 3 is a graph of characteristic curves illustrating the relationship between the number of generated bits and the bin size.

FIG. 3 is a graph of characteristic curves indicating the relationship between the number of generated bits and the bin size x. In FIG. 3, the symbol L1 indicates a curve representing a linear approximation of the actual results for the number of generated bits. The symbol L2 indicates a curve representing an approximation of the actual number of generated bits that is quadratic for bin size values less than the threshold value TH, and linear for bin size values greater than the threshold value TH. Based on the results of actual measurements, it has been found that when the bin size x is less than the threshold value TH, a quadratic approximation that varies according to the bin size x more accurately expresses the number of generated bits compared to a linear approximation. However, it has also been found that a quadratic approximation is less accurate when the bin size x is greater than the threshold value TH, and in such cases the accuracy is improved with the use of a linear approximation.

Consequently, in the present embodiment, the predicted number of bits y is calculated using a predictive function $y=f(x)$ defined as follows, wherein a first function is used for bin size values less than the threshold value TH, and a second function is used for bin size values greater than the threshold value TH, and wherein the first function and the second function are a quadratic function and a linear function, respectively. In the formula (1) below, d represents the threshold value TH, while a, b, c, e, and f are polynomial coefficients. The threshold value d and the coefficients a, b, c, e, and f are thus constants that define the characteristic curve indicated by the symbol L2 in FIG. 3.

$$\begin{aligned}&\text{Formula (1)}\\&\quad\text{if } (x < d) \, \{\\&\quad\quad y = ax^2 + bx + c\\&\quad\} \text{else} \{\\&\quad\quad y = ex + f\\&\quad\} \quad \ldots (1)\end{aligned}$$

The code length predictor 26 includes a table that stores successive pairs of associated values for the bin size and the predicted number of bits, as shown in FIG. 4. The code length predictor 26 outputs a predicted number of bits y as given by the formula (1) by referring to this table and retrieving the predicted number of bits associated with the bin size output from the binarization unit 25.

The binary data buffer 27 temporarily stores the binary symbol series output from the binarization unit 25, and subsequently outputs symbol values from the stored binary symbol series in accordance with processing by the binary arithmetic coder 17.

Figure 5:
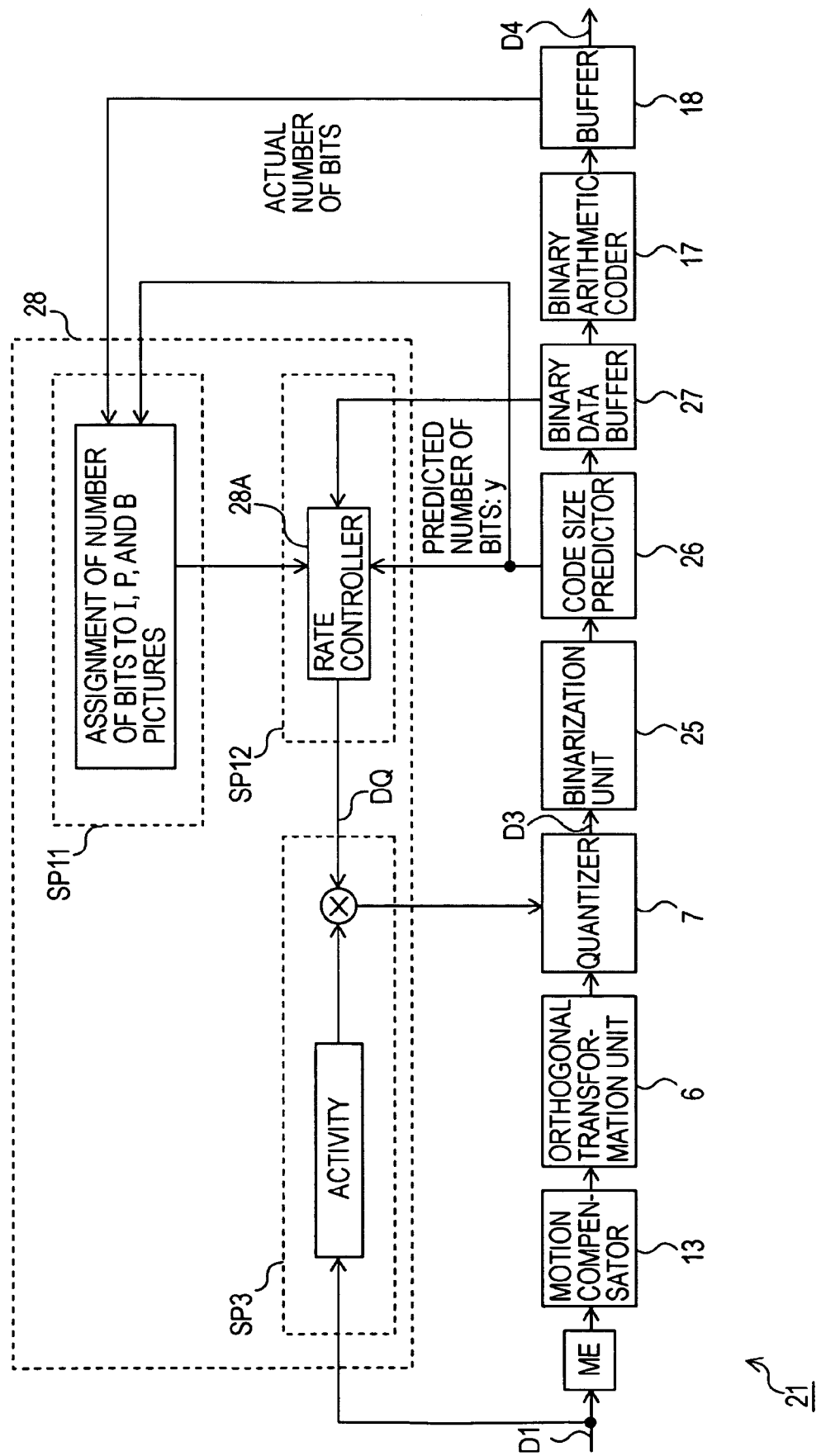
FIG. 5 is a block diagram to aid in the explanation of bit rate control.
Figure 10:
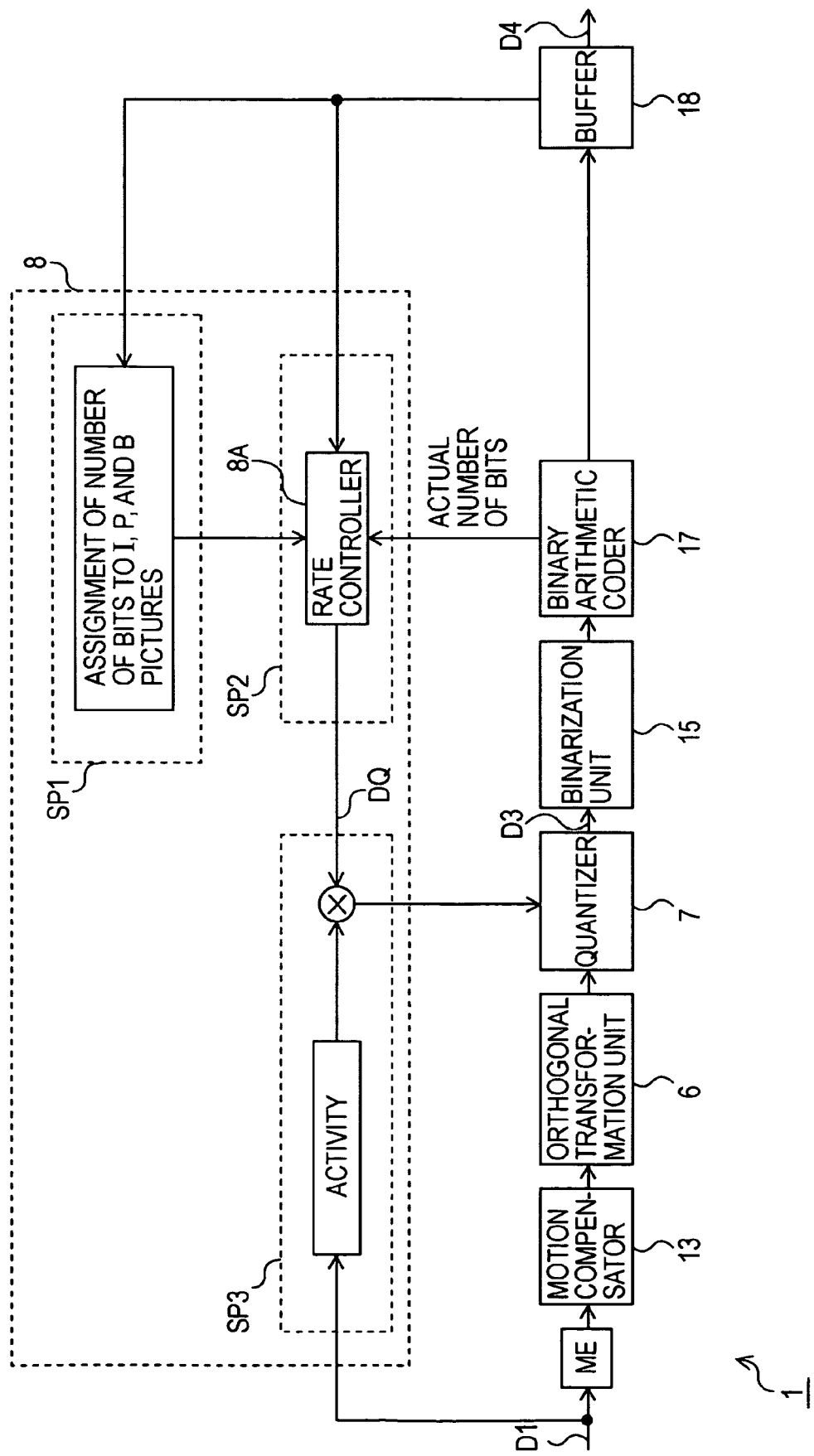
FIG. 10 is a block diagram to aid in the explanation of bit rate control in a coding apparatus of the related art.

FIG. 5 is a block diagram illustrating, by way of contrast with FIG. 10, the portions of the configuration related to bit rate control in the coding apparatus 21. The controller 28 is a means for controlling the coding apparatus 21. The controller 28 selects the optimal prediction mode for processing the input picture data D1, and then issues commands to the motion compensator 13 and the intra-prediction unit so as to generate prediction data D2 in accordance with the optimal prediction mode. In addition, the controller 28 executes rate control processing by using the rate controller 28A to switch to quantization scale of the quantizer 7.

In this portion of the configuration related to bit rate control, the controller 28 is configured identically to the controller 8 described above with reference to FIG. 10, except in that the bit allocation processing in step SP11 and the processing conducted by the rate controller 28A in step SP12 differ. In the bit allocation processing of step SP11, the controller 28 calculates a target number of bits on the basis of the predicted number of bits y issued from the code length predictor 26.

More specifically, the controller 28 divides the target bit rate of the coded data D4 by the number of GOPs per unit time, thereby calculating the target number of bits allocatable to a single GOP. In addition, the controller 28 may also distribute the target number of bits for a single GOP thus calculated to each picture according to a ratio defined by picture type, thereby calculating the target number of bits for the picture currently being coded.

When calculating the target number of bits for the picture currently being coded, the controller 28 keeps a per-picture total of the predicted number of bits y issued from the code length predictor 26, and each time the binarization unit 25 completes the processing for a single picture, the controller 28 re-calculates the target number of bits allocatable to the remaining pictures in the current GOP. For example, consider the case wherein the target bit rate for the coded data D4 is divided by the number of GOPs per unit time to yield a per-GOP target number of bits M. Furthermore, Y is taken to be the cumulative value of the predicted number of bits y for a single picture that has been processed by the binarization unit-25 from among the 15 pictures constituting a single GOP. In this case, a number of bits equal to (M−Y) is re-allocated to the remaining 14 pictures according to picture type, thereby calculating the target number of bits for the picture to be subsequently processed.

Furthermore, the controller 28 uses memory not shown in the drawings to save the cumulative value Y of the predicted number of bits y that is used when computing the target code length for the picture to be subsequently processed. The controller 28 then monitors the amount of free space in the buffer 18, and when the controller 28 detects the actual number of bits in the coded data D4 with regard to the picture for which the cumulative value Y stored in the memory was computed, the controller 28 calculates the error between the cumulative value Y of the predicted number of bits y and the number of bits in the coded data D4. The controller 28 then uses the error value to correct the target number of bits for the picture to be subsequently processed.

As a more specific example, consider the case wherein two pictures from among a single GOP (having 15 pictures) are processed by the binarization unit 25 with cumulative values Y1 and Y2 for their predicted numbers of bits, respectively. In this case, the controller 28 reallocates a number of bits equal to (M−Y1−Y2) to the remaining 13 pictures according to picture type, thereby calculating the target number of bits m for the picture to be subsequently processed. If Z1 is taken to be the number of bits in the coded data D4 for the first picture, then an error value (Y1−Z1) is distributed, according to picture type, among the 14 remaining pictures when the processing for the first picture is completed. As a result, a correction value z2 is calculated for the pictures to be subjected to error correction processing. The correction value z2 is then subtracted from the target number of bits m that was previously calculated for the picture to be subsequently processed. It should be appreciated that a variety of correction methods may be applied with regard to this correction of the target number of bits using the error between the cumulative value Y of the predicted number of bits y and the actual number of bits in the coded data D4. For example, the target number of bits may be corrected by subtracting the error from the code lengths allocatable to the remaining pictures that constitute a single GOP.

Each time a single picture is processed, the controller 28 divides the target number of bits calculated for the picture to be subsequently processed by the number of macroblocks constituting a single picture, thereby calculating the target number of bits for a single macroblock. The controller 28 then issues the target number of bits per macroblock thus calculated to the rate controller 28A.

During the processing conducted by the rate controller 28A indicated by step SP12, the controller 28 controls the quantization scale of the quantizer 7 on a per-macroblock basis by using a feedback control from the rate controller 28A. The controller 28 controls the quantization scale of the quantizer 7 using not the number of bits in the coded data D4, but rather the predicted number of bits y issued from the code length predictor 26 as a basis therefor.

More specifically, the controller 28 outputs quantization scale data DQ that determines the quantization scale of the quantizer 7 according to the target number of bits that was issued as a result of the bit allocation processing in step SP11, the scale being modified such that the predicted number of bits y becomes the target number of bits calculated in step SP11. In this case, the controller 28 corrects and outputs the quantization scale data DQ according to the predicted number of bits y for the preceding macroblock. More specifically, when the predicted number of bits y is large with respect to the target number of bits, the quantization scale data DQ is corrected such that the quantization step size is increased and the number of generated bits is decreased. In contrast, when the predicted number of bits y is small with respect to the target number of bits, the quantization scale data DQ is corrected such that the quantization step size is decreased and the number of generated bits is increased.

Furthermore, during the processing of step SP12, the controller 28 also monitors the available free space in the binary data buffer 27 and predicts overflows in the binary data buffer 27. More specifically, the controller 28 compares the available free space in the binary data buffer 27 to a given cut-off value, and when the available free space in the binary data buffer 27 falls below the cut-off value, the controller 28 predicts that a buffer overflow will occur. The cut-off value may a fixed or variable value. If the cut-off value is a variable value, the variation may be such that the cut-off value decreases as the level of activity increases, for example.

When the controller 28 predicts an overflow in the binary data buffer 27, the controller 28 corrects and outputs quantization scale data DQ that increases the quantization step size of the quantization scale of the quantizer 7 that is determined from the target number of bits and the predicted number of bits y. Consequently, the controller 28 prevents overflows in the binary data buffer 27 by setting the quantization scale such that the number of generated bits becomes less than the target number of bits.

In addition, the controller 28 keeps a running total of the predicted numbers of bits issued from the code length predictor 26 in predefined units for judgment, the running total being used to calculated the residing-in-buffer data size of a coded picture buffer (CPB) that acts as the input buffer for a hypothetical reference decoder (HRD). One unit for judgment may be defined as being equivalent to a single macroblock, for example. The controller 28 then predicts whether or not a buffer underrun in the CPB will occur by comparing the value of the running total to a given cut-off value. When the controller 28 predicts a buffer underrun in the CPB, the controller 28 executes processing to avoid the CPB underrun. This processing to avoid a CPB underrun may involve, for example, aborting the coding of the subsequent macroblock, and then outputting a control code to the buffer 18 that issues a command to output picture data for the current macroblock that is identical to the picture data of the preceding macroblock.

(2) Operation of the Embodiment

As a result of the above configuration, the following occurs in the coding apparatus 21 (cf. FIGS. 1 and 5). First, input picture data D1 is input whose frames have been sorted according to the GOP structure, and the optimal prediction mode for the input picture data D1 is determined. Subsequently, prediction values D2 are generated from the input picture data D1 by the motion compensator 13 or the intra-prediction unit, depending on the optimal prediction mode. The prediction error in the predicted values D2 is then solved for by the subtractor 5. The orthogonal transformation unit 6 then applies an orthogonal transformation to the prediction error with regard to the input picture data D1, thereby generating coefficient data. The coefficient data is subsequently quantized by the quantizer 7. The output data from the quantizer 7 is then successively processed by the dequantizer 9 and the inverse orthogonal transformation unit 10 to obtain decoded reference picture data for the input picture data D1. This reference picture data is stored in the frame memory 12. Subsequently, predicted values D2 for the next macroblock are generated using the reference picture data. Meanwhile, the output data from the quantizer 7 is also input into the arithmetic coder 23 along with information such as motion vectors and prediction mode data, and the data is then subjected to arithmetic coding using CABAC.

More specifically, in the binarization unit 25 of the arithmetic coder 23, syntax elements of the input picture data D1 are converted into binary according to rules that depend on the type of the respective syntax element, thereby generating a series of variable-length binary symbols. Each bit of the binary symbols that constitute the binary symbol series of the input picture data D1 is then subjected to context calculation by the context calculation unit 16 to obtain a probability state variable. The binary symbols are then coded by the binary arithmetic coder 17 using these probability state variables. The output data of the binary arithmetic coder 17 is stored in the buffer 18 and header information or similar data is applied thereto. The resulting coded data D4 is then output as part of a bitstream.

In the coding apparatus 21, the rate controller 28A of the controller 28 controls the quantization scale of the quantizer 7 so as to control the number of generated bits such that the coded data D4 is output at a target bit rate.

In the coding apparatus 21 of the related art (cf. FIG. 9), bit rate control processing is executed by means of a per-macroblock feedback control that operates on the basis of the actual number of bits in the coded data D4 as ascertained by monitoring the available free space-in the buffer 18. For this reason, coding the input picture data D1 in real-time requires a configuration wherein the complex processing conducted by the arithmetic coder 3 can be conducted at high speeds. As a result, the configuration of the arithmetic coder 3 becomes complex, thus increasing the scale of circuitry involved therein and the energy consumed thereby.

By contrast, in the coding apparatus 21 in accordance with the present embodiment, the number of bits in the coded data is predicted from the bin sizes in the binary symbols output from the binarization unit 25. A per-macroblock feedback control is then used to control the quantization scale of the quantizer 7 such that the predicted number of bits becomes equal to the target number of bits.

As a result, in the coding apparatus 21, after the processing for a single macroblock has completed and before the binary arithmetic coding is conducted, processing is commenced to set the quantization scale for the next macroblock. Thus, real-time coding of input picture data and bit rate control therefor can be executed without. increasing the processing speed of the binary arithmetic coder 17. Moreover, since the processing speed of the binary arithmetic coder 17 need not be increased, the configuration thereof can be simplified, and increases in the energy consumed thereby can be prevented.

However, delivery of the coded data D4 at the target bit rate may become impossible if the predicted number of bits is not accurately calculated from the bin size. Consequently, the code length predictor 26 of the coding apparatus 21 calculates a predicted number of bits from the bin size with the use of a predictive function whose predicted values for the number of bits increases as the bin size increases, and furthermore whose polynomial degree changes once the bin size exceeds a threshold value. Rate control processing is then executed using the predicted number of bits thus calculated. As a result, the coding apparatus 21 is-able to accurately conduct rate control and deliver coded data D4 at the target bit rate, even though rate control is conducted by predicting the number of generated bits from the bin size. Moreover, coded data D4 having high image quality is also output as a result.

More specifically, the coding apparatus 21 calculates a predicted number of bits from the bin size using a predictive function whose polynomial degree changes from quadratic to linear as the bin size increases. As a result, the coding apparatus 21 is able to accurately conduct rate control and deliver coded data D4 at the target bit rate, even though rate control is conducted by predicting the number of generated bits from the size. Moreover, coded data D4 having high image quality is also output as a result.

The binarization unit 25 of the coding apparatus 21 keeps a running total of the bin size on a per-macroblock basis. This running total is then input into the code length predictor 26, where the predictive function is used to calculate a predicted number of bits y per macroblock.

The controller 28 of the coding apparatus 21 also distributes the number of bits allocatable to a single GOP among the pictures therein, thereby calculating the target number of bits for the picture currently being processed. The controller 28 also uses the cumulative value of the predicted number of bits y to solve for the generated code length predicted for the pictures in the current GOP whose binary conversion has already been completed. The generated code length predicted for the pictures already converted into binary is then used to solve for the number of bits allocatable to the remaining pictures in the GOP. The number of bits allocatable to the remaining pictures are then distributed to thereby calculate the target number of bits for the picture currently being processed. As a result, in the present embodiment, the predicted number of bits is used instead of the actual number of generated bits in the processing to compute the target number of bits for each picture, and thus the speed of the rate control processing is increased.

In addition, the actual number of bits in the coded data D4 is detected via the buffer 18, and the target number of bits for the picture currently being processed is corrected using the error value between the predicted number of bits and the actual number of bits in the coded data D4. As a result, accumulation of error is prevented when calculating the target number of bits by applying the predicted number of bits instead of the actual number of bits in the coded data D4, and thus the accuracy of the rate control is improved in the coding apparatus 21. Subsequently, the target number of bits for the picture currently being processed is divided by the number of macroblocks, thereby calculating the target number of bits for a single macroblock.

The quantization scale of the quantizer 7 is then set such that predicted number of bits y that was solved for by the code length predictor 26 becomes equal to the target number of bits described above. In addition, the quantization scale set in the quantizer 7 is corrected according to the level of activity detected by an activity detector.

As a result of this series of rate control processes conducted in the coding apparatus 21, a cumulative bin size per macroblock is calculated, and then a predicted number of bits y is subsequently solved for by evaluating a predictive function using the cumulative bin size as the argument of the function. Since the processing to solve for the predicted number of bits using the predictive function is executed on a per-macroblock basis, the processing is simplified.

Furthermore, the predicted number of bits y according to the predictive function may also be solved for by accessing a look-up table provided in the code length predictor 26. In so doing, solving for the predicted number of bits is achieved with trivial processing.

In addition, the output data from the binarization unit 25 is input into the binary arithmetic coder 17 via the binary data buffer 27. The coding apparatus 21 is configured in this way in consideration of the following. As described earlier, a predicted number of bits is calculated from the bin size, and this predicted number of bits is subsequently used to conduct rate control. In this case, although high-speed processing is not required in the binary arithmetic coder 17, it is desirable for the binarization unit 25 to perform coding at high speeds. Consequently, there is concern in this case that binary data exceeding the processing ability of the binary arithmetic coder 17 will be instantaneously output from the binarization unit 25, causing the processing of the binary arithmetic coder 17 to fail.

However, if the output data from the binarization unit 25 is input into the binary arithmetic coder 17 via a binary data buffer 27 as in the present embodiment, fluctuations in the bit rate of the binary data input into the binary arithmetic coder 17 are alleviated due to the presence of the binary data buffer 27. As a result, processing failures in the binary arithmetic coder 17 can be avoided, even if the configuration of the binary arithmetic coder 17 is simplified and the throughput of the binary arithmetic coder 17 is reduced. Consequently, by configuring the coding apparatus 21 such that the output data from the binarization unit 25 is input into the binary arithmetic coder 17 via the binary data buffer 27, the configuration of the binary arithmetic coder 17 can be simplified, and thus the scale of circuitry involved therein and the energy consumed thereby can be reduced.

However, when the output data of the binarization unit 25 is input into the binary arithmetic coder 17 via the binary data buffer 27 as described above, it becomes difficult to correctly perform arithmetic coding on the binary data in a continuous manner due to buffer overflows in the binary data buffer 27. For this reason, the coding apparatus 21 is configured such that the controller 28 predicts that a buffer overflow will occur when the available free space in the binary data buffer 27 falls below a cut-off value. When a buffer overflow is predicted, the controller 28 reconfigures the quantization scale of the quantizer 7 so as to increase the quantization step size, thereby constraining the bin size of the binary data. In so doing, overflows in the binary data buffer 27 are prevented.

The AVC standard also defines a hypothetical reference decoder (HRD) having a coded picture buffer (CPB) that acts as the input buffer for the HRD. It is desirable to additionally conduct rate control such that buffer underruns do not occur in the CPB. In the coding apparatus 1 of the related art, CPB-related rate control is also executed using the actual number of bits in the coded data D4 as a basis therefor.

In the present embodiment, a configuration whereby a predicted number of bits is solved for using the bin size is effectively used to conduct CPB-related rate control. More specifically, the controller 28 keeps a running total of the predicted numbers of bits per slice, the slice acting as the unit for judgment when determining buffer underruns. When the cumulative value of the predicted numbers of bits falls below a cut-off value, the controller 28 predicts that a buffer underrun will occur in the CPB. In addition, when such a buffer underrun is predicted, processing to avoid the buffer underrun is also executed.

Since a predicted number of bits is computed from the bin size in the present embodiment, buffer underruns are more reliably predicted before such buffer underruns actually occur as compared to the processing of the related art wherein the number of bits in the coded data D4 is used as a basis for processing. In other words, the present embodiment is able to predict buffer underruns earlier than the related art. Consequently, compared to the related art, the present embodiment does not execute processing to avoid buffer underruns unnecessarily. As a result, the present embodiment is able to output coded data D4 having higher image quality than that of the related art.

(3) Advantages of the Embodiment

As a result of the foregoing configuration, rate control is conducted by predicting a number of generated bits from the bin size with the use of a predictive function whose polynomial degree changes once the bin size exceeds a threshold value. In so doing, the portions of the configuration related to arithmetic coding processing can be simplified as compared to that of the related art, and thus the scale of circuitry involved therein and the energy consumed thereby can be reduced.

More specifically, the number of generated bits is predicted from the bin size with the use of a predictive function whose polynomial degree changes from quadratic to linear as the bin size increases. In so doing, rate control processing is executed with sufficient accuracy, and the portions of the configuration related to arithmetic coding processing can be simplified as compared to that of the related art, and thus the scale of circuitry involved therein and the energy consumed thereby can be reduced.

In addition, a cumulative value for the bin size is obtained by keeping a running total of the bin sizes for each rate control unit. By subsequently solving for the predicted value by evaluating the predictive function using the cumulative value, the predicted value can be obtained using trivial processing.

Furthermore, the predicted value may also be output by accessing a memory that stores successive pairs of an associated bin size and predicted number of bits. In so doing, the predicted value can be obtained with a trivial configuration.

In addition, this predicted number of bits may be used to predict the occurrence of buffer underruns in an input buffer memory provided for a hypothetical reference decoder (HRD), and subsequently execute processing to avoid the buffer underrun. In so doing, coded data D4 is output having higher image quality than that of the related art.

Second Embodiment

Figure 6:
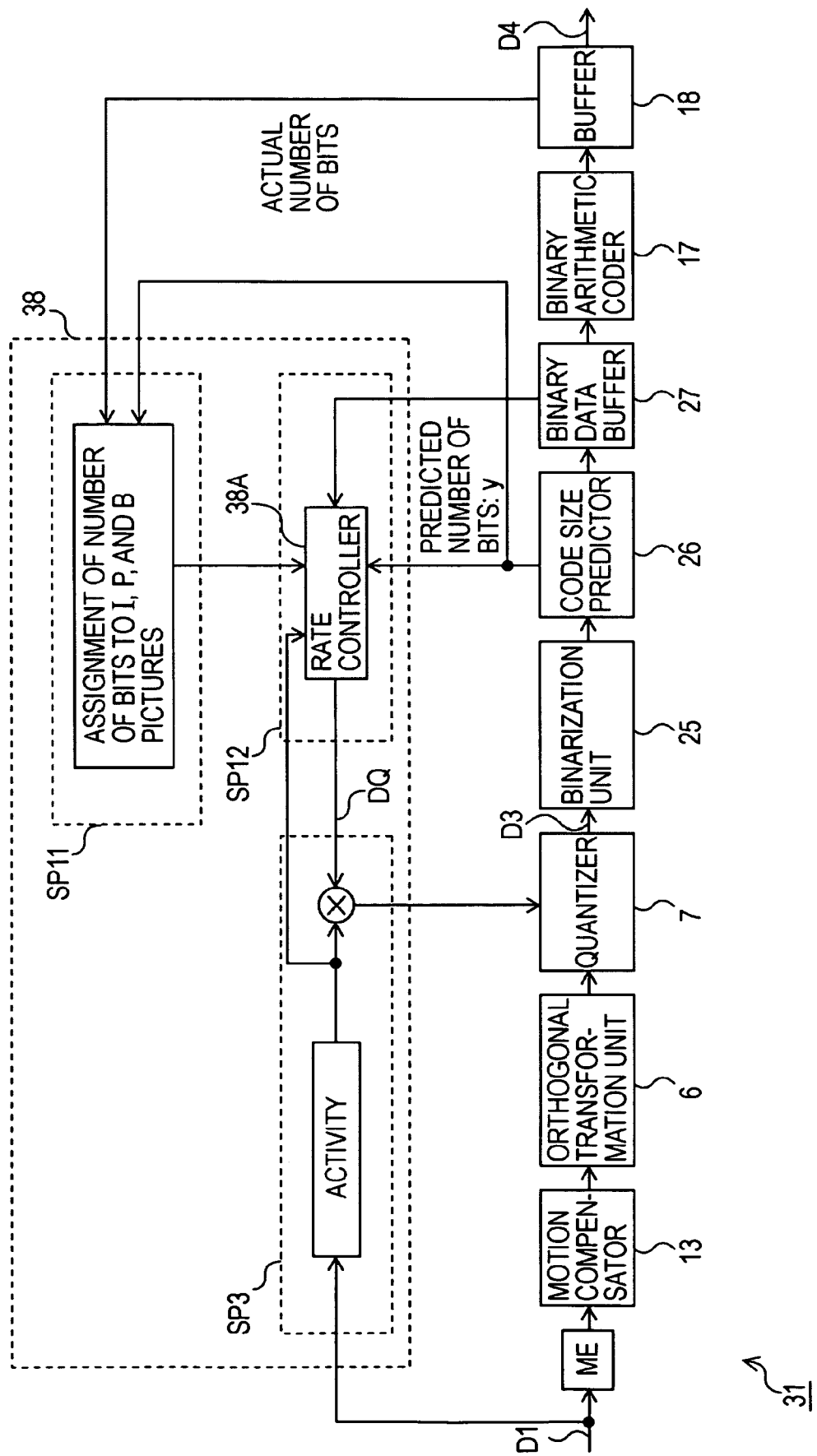
FIG. 6 is a block diagram to aid in the explanation of a coding apparatus in accordance with a second embodiment of the present invention.

FIG. 6 is a block diagram illustrating, by way of comparison with FIG. 5, the configuration of a coding apparatus in accordance with a second embodiment of the present invention. The coding apparatus 31 illustrated in FIG. 6 is provided with a controller 38 in place of the controller 28. The controller 38 herein is configured identically to the controller 28 in accordance with foregoing embodiment, except in that a rate controller 38A has been provided in place of the rate controller 28A.

Using the rate controller 38A, the controller 38 in accordance with the present embodiment dynamically varies the predictive function according to the level of activity detected by the activity detector. The rate controller 38A is configured identically to the rate controller 28A, except in that the rate controller 38A is also configured to dynamically vary the predictive function according to the level of activity as described above.

More specifically, when the level of activity exceeds a predefined judgment value, the rate controller 38A varies the predictive function such that the function approaches a linear function. More specifically, the predictive function may be varied so as to approach a linear function by decreasing the value of the coefficient a in the formula (1) and additionally decreasing the threshold value TH (d), while also modifying the values of the coefficients e and f in conjunction with the change in the threshold value TH.

From the results of a variety of investigations, it has been found that for noise-like input picture data having high activity, the accuracy of the predicted number of bits y is improved by making the approximate curve more linear. Consequently, in the present embodiment the predictive function is dynamically varied according to the level of activity, thereby improving the accuracy of the rate control, and thus improving image quality.

As a result of the present embodiment, the predictive function is varied according to the level of activity in the input picture data. In so doing, the accuracy of the rate control is improved, thereby improving image quality.

Third Embodiment

Figure 7:
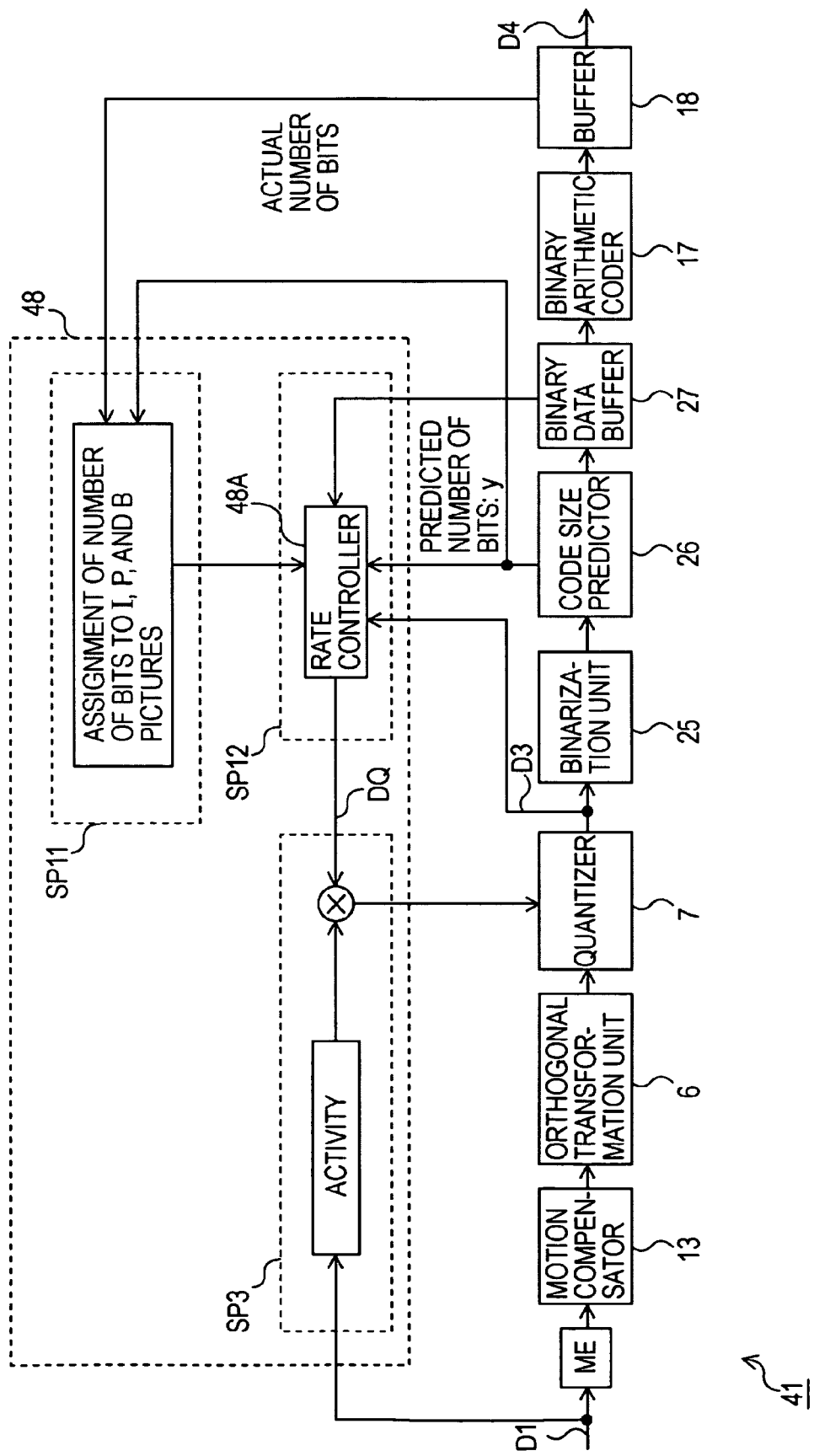
FIG. 7 is a block diagram to aid in the explanation of a coding apparatus in accordance with a third embodiment of the present invention.

FIG. 7 is a block diagram illustrating, by way of comparison with FIG. 5, the configuration of a coding apparatus in accordance with a third embodiment of the present invention. The coding apparatus 41 illustrated in FIG. 7 is provided with a controller 48 in place of the controller 28. The controller 48 herein is configured identically to the controller 28 in accordance with the embodiment described previously, except in that a rate controller 48A has been provided in place of the rate controller 28A.

Using the rate controller 48A, the controller 48 in accordance with the present embodiment dynamically varies the predictive function according to the values in the output data output from the quantizer 7. The rate controller 48A is configured identically to the rate controller 28A, except in that the rate controller 48A is also configured to dynamically vary the predictive function according to the values in the output data output from the quantizer 7 as described above.

More specifically, the controller 48 calculates the sum of the absolute values for each macroblock in the output data output from the quantizer 7. The sum of the squares of the values may also be used in place of the sum of the absolute values. Subsequently, the controller 48 compares the sum of the absolute values to a predefined judgment value. If the sum of the absolute values is less than the judgment value, the controller 48 varies the predictive function so as to approach a linear function.

From the results of a variety of investigations, it has been found that when values in the output data output from the quantizer 7 are small, the accuracy of the predicted number of bits y is improved by making the approximate curve more linear. Consequently, in the present embodiment the predictive function is dynamically varied according to the values in the output data output from the quantizer 7, thereby improving the accuracy of the rate control, and thus improving image quality.

As a result of the present embodiment, the predictive function is varied according to the values in the output data output from a quantizer. In so doing, the accuracy of the rate control is improved, thereby improving image quality.

Fourth Embodiment

Figure 8:
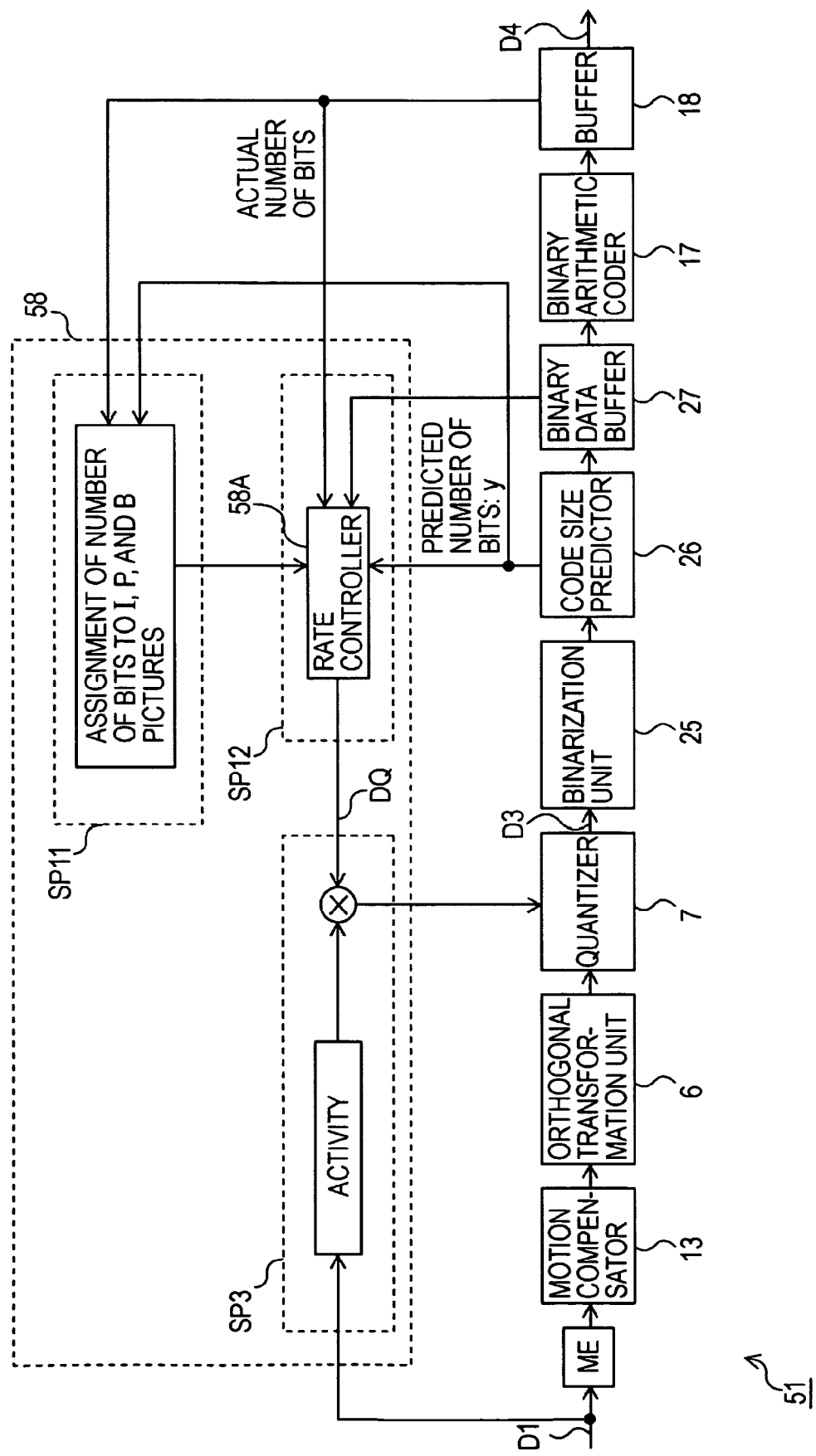
FIG. 8 is a block diagram to aid in the explanation of a coding apparatus in accordance with a fourth embodiment of the present invention.

FIG. 8 is a block diagram illustrating, by way of comparison with FIG. 5, the configuration of a coding apparatus in accordance with a fourth embodiment of the present invention. The coding apparatus 51 illustrated in FIG. 8 is provided with a controller 58 in place of the controller 28. The controller 58 herein is configured identically to the controller 28 in accordance with the embodiment described previously, except in that a rate controller 58A has been provided in place of the rate controller 28A.

Using the rate controller 58A, the controller 58 in accordance with the present embodiment dynamically varies the predictive function according to the data compression ratio of the coded data D4. The rate controller 58A is configured identically to the rate controller 28A, except in that the rate controller 58A is also configured to dynamically vary the predictive function according to the data compression ratio of the coded data D4 as described above.

More specifically, the controller 58 detects the compression ratio of each macroblock in the coded data D4, using either the number of bits or the number of predicted bits y for a respective macroblock in the coded data D4. In addition, the controller 58 compares either the number of bits or the predicted number of bits y for a single macroblock to a predefined judgment value. If the number of bits or the predicted number of bits y for the single macroblock is less than the judgment value, and additionally, if the data compression ratio is greater than a value determined from the judgment value, then the controller 58 varies the predictive function so as to approach a linear function.

From the results of a variety of investigations, it has been found that when the data compression ratio of the coded data D4 is large, the accuracy of the predicted number of bits y is improved by making the approximate curve more linear. Consequently, in the present embodiment the predictive function is dynamically varied according to the data compression ratio of the coded data D4, thereby improving the accuracy of the rate control, and thus improving image quality.

As a result of the present embodiment, the predictive function is varied according to the data compression ratio of the coded data D4. In so doing, the accuracy of the rate control is improved, thereby improving image quality.

Fifth Embodiment

In the fifth embodiment, the controller determines the amount of time required for the binary arithmetic coder to process the binary symbols in a single macroblock. If the amount of time required is less than a fixed amount of time, rate control processing is executed using the actual number of bits in the coded data D4 rather than a predicted number of bits. The coding apparatus in accordance with the present embodiment is configured identically to those of the embodiments described previously, except in that the controller is also configured to switch the basis of the rate control as described above.

As a result of the present embodiment, rate control processing is executed using the actual number of bits in the coded data D4 rather than a predicted number of bits in the case where the amount of time required for the binary arithmetic coder to process the binary symbols is less than a fixed amount of time. Consequently, reductions in the accuracy of the rate control due to the error between the predicted number of bits and the actual number of bits in coded data D4 are effectively avoided, and advantages similar to those of the foregoing embodiments are obtained.

Sixth Embodiment

In the foregoing embodiments, the predicted number of bits is solved for after calculating the cumulative bin size per macroblock. However, the present invention is not limited thereto, and the opposite of the above may also be performed. More specifically, a predicted number of bits may be first solved for from the respective bin size of each set of binary data, and then the resulting plurality of predicted numbers of bits may be summed to yield a cumulative value for the predicted number of bits on a per-macroblock basis.

In addition, in the foregoing embodiments, a predictive function is generated whose polynomial degree changes from quadratic to linear once the bin size exceeds a threshold value. However, the present invention is not limited thereto, and a predictive function may be generated having polynomial degrees other than the above. As long as a predictive function is generated whose polynomial degree changes once a given threshold value is exceeded, advantages similar to those of the foregoing embodiments can be obtained.

In addition, in the foregoing embodiments, the unit of rate control is taken to be the macroblock, which also acts as the unit of coding processing. However, the present invention is not limited thereto, and the unit of rate control may be variously configured, such as taking a single unit of rate control to be two macroblocks, for example.

In addition, in the second, third, and fourth embodiments described in the foregoing, the predictive function is varied between two states. However, the present invention is not limited thereto, and the predictive function may be varied among three or more states.

In addition, in the second, third, and fourth embodiments described in the foregoing, the predictive function is varied on a per-macroblock basis. However, the present invention is not limited thereto, and the predictive function may also be varied on the basis of a plurality of macroblocks.

In addition, in the foregoing embodiments, the predictive function is respectively varied according to a single factor, such as the level of activity in the case of the second embodiment. However, the present invention is not limited thereto, and an embodiment may also be realized wherein the configurations of the foregoing embodiments have been combined.

In addition, in the foregoing embodiments, rate control processing is executed while also calculating a target number of bits from the predicted number of bits for the picture currently being processed. However, the present invention is not limited thereto, and the calculation of the target number of bits for the picture currently being processed may also be conducted using the code length of the coded data D4. In this case, when the binary arithmetic coder requires a significant amount of time for processing, the target number of bits for the picture currently being processed may be calculated from the number of bits in the coded data detected for picture that is two frames prior to the picture currently being processed, the calculation being conducted by distributing the allocatable bits among the remaining pictures (including the picture one frame prior to the picture currently being processed).

In addition, in the foregoing embodiments, it is assumed that the input picture data is to be processed in real-time. However, the present invention is not limited thereto, and thus may be broadly applied to cases wherein the input picture data is not processed in real-time.

In addition, in the foregoing embodiments, the present invention is applied to an AVC coding apparatus. However, the present invention is not limited thereto, and thus may be broadly applied to coding apparatuses using various arithmetic coding schemes other than AVC.

In addition, in the foregoing embodiments, the configuration of the coding apparatus is described as being realized in hardware. However, the present invention is not limited thereto, and thus may be broadly applied to coding apparatuses whose configurations are realized in software, such as by an editing program on a computer, for example. In this case, the software-based program may be provided recorded upon a recording medium such as an optical disc, magnetic disk, memory card, or similar medium.

Alternatively, the software-based program may be provided by downloading the program via a network such as the Internet.

It should be understood by those skilled in the art that various modifications, combinations, sub-combinations and alterations may occur depending on design requirements and other factors in so far as they are within the scope of the appended claims or the equivalents thereof.

What is claimed is:

1. A coding apparatus, comprising:

an orthogonal transformation unit that applies an orthogonal transformation to an input signal and outputs the resulting coefficient data;

a quantizer that quantizes the coefficient data;

an arithmetic coder that performs arithmetic coding on the output data from the quantizer and outputs the resulting coded data; and a controller that executes rate control processing to control the quantization scale of the quantizer; wherein the arithmetic coder includes a binarization unit that converts the output data from the quantizer into binary symbols, a binary arithmetic coder that performs binary arithmetic coding on the binary symbols and outputs the resulting coded data, and a code length predictor that outputs a predicted number of bits in the coded data on the basis of the bin size of the binary symbols, the controller executes rate control processing to control the quantization scale of the quantizer on the basis of the predicted number of bits, the code length predictor outputs the predicted number of bits by evaluating a predefined predictive function using the bin size as the argument of the function, and the predictive function is a polynomial function defined such that the predicted number of bits increases as the bin size increases, and furthermore such that the polynomial degree of the function changes when the bin size exceeds a predefined threshold value.

2. A coding method, comprising the steps of:

applying an orthogonal transformation to an input signal and outputting the resulting coefficient data;

quantizing the coefficient data;

performing arithmetic coding on the output data from the quantizing step and outputting the resulting coded data; and executing rate control processing to control the quantization scale used in the quantizing step; wherein the arithmetic coding step further includes the steps of converting the output data from the quantizing step into binary symbols, performing binary arithmetic coding on the binary symbols and outputting the resulting coded data, and predicting code length by outputting a predicted number of bits in the coded data on the basis of the bin size of the binary symbols, in the rate control step, rate control processing is executed to control the quantization scale used in the quantizing step on the basis of the predicted number of bits, in the code length prediction step, the predicted number of bits is output by evaluating a predefined predictive function using the bin size as the argument of the function, and the predictive function is a polynomial function defined such that the predicted number of bits increases as the bin size increases, and furthermore such that the polynomial degree of the function changes when the bin size exceeds a predefined threshold value.

3. The coding method according to claim 2, wherein the polynomial degree of the predictive function changes from quadratic to linear as the bin size increases.

4. The coding method according to claim 2, wherein
in the code length prediction step, a cumulative value for the bin sizes in a control unit of the rate control is obtained by summing the plurality of bin sizes belonging to that control unit, and
the predicted number of bits is output by evaluating the predictive function using the cumulative value as the argument of the function.

5. The coding method according to claim 2, wherein
the predicted number of bits is output by accessing memory storing successive pairs of associated values for the bin size and the predicted number of bits.

6. The coding method according to claim 2, wherein
in the rate control step,
   a predicted number of bits for a fixed unit of judgment set for the input signal is detected by summing the plurality of predicted numbers of bits belonging to that unit of judgment,
   a buffer underrun in a buffer memory provided as the input buffer of a hypothetical reference decoder is predicted by comparing the predicted number of bits for a unit of judgment to a cut-off value, and
   when the occurrence of a buffer underrun in the buffer memory is predicted, processing is executed to avoid the predicted buffer underrun.

7. The coding method according to claim 2, wherein
in the rate control step, the predictive function is varied according to the level of activity in the input signal.

8. The coding method according to claim 2, wherein
in the rate control step, the predictive function is varied according to the values in the output data from the quantizing step.

9. The coding method according to claim 5, wherein
in the rate control step, the predictive function is varied according to the data compression ratio of the coded data.

10. The coding method according to claim 2, wherein
in the rate control step,
   the amount of time required to process the binary symbols in the binary arithmetic coding step is determined, and
   when the required amount of time is less than a fixed amount of time, the rate control processing is executed using the number of bits in the coded data rather than the predicted number of bits.

11. A computer readable medium that stores a program executable by a coding apparatus, the program, when executed, causing the coding apparatus to perform a coding method that codes an input signal, the coding method comprising the steps of:
   applying an orthogonal transformation to an input signal and outputting the resulting coefficient data;
   quantizing the coefficient data;
   performing arithmetic coding on the output data from the quantizing step and outputting the resulting coded data; and
   executing rate control processing to control the quantization scale used in the quantizing step; wherein
   the arithmetic coding step further includes the steps of
      converting the output data from the quantizing step into binary symbols,
      performing binary arithmetic coding on the binary symbols and outputting the resulting coded data, and
      predicting code length by outputting a predicted number of bits in the coded data on the basis of the bin size of the binary symbols,
   in the rate control step, rate control processing is executed to control the quantization scale used in the quantizing step on the basis of the predicted number of bits,
   in the code length prediction step, the predicted number of bits is output by evaluating a predefined predictive function using the bin size as the argument of the function, and
   the predictive function is a polynomial function defined such that the predicted number of bits increases as the bin size increases, and furthermore such that the polynomial degree of the function changes when the bin size exceeds a predefined threshold value.

12. A recording medium storing a program for executing a coding method that codes an input signal, the coding method being executed by a coding apparatus and comprising the steps of:
   applying an orthogonal transformation to an input signal and outputting the resulting coefficient data;
   quantizing the coefficient data;
   performing arithmetic coding on the output data from the quantizing step and outputting the resulting coded data; and
   executing rate control processing to control the quantization scale used in the quantizing step; wherein
   the arithmetic coding step further includes the steps of
      converting the output data from the quantizing step into binary symbols,
      performing binary arithmetic coding on the binary symbols and outputting the resulting coded data, and
      predicting code length by outputting a predicted number of bits in the coded data on the basis of the bin size of the binary symbols,
   in the rate control step, rate control processing is executed to control the quantization scale used in the quantizing step on the basis of the predicted number of bits,
   in the code length prediction step, the predicted number of bits is output by evaluating a predefined predictive function using the bin size as the argument of the function, and
   the predictive function is a polynomial function defined such that the predicted number of bits increases as the bin size increases, and furthermore such that the polynomial degree of the function changes when the bin size exceeds a predefined threshold value.

* * * * *